(12) United States Patent
Chou et al.

(10) Patent No.: US 7,786,571 B2
(45) Date of Patent: Aug. 31, 2010

(54) HEAT-CONDUCTIVE PACKAGE STRUCTURE

(75) Inventors: Pao-Hung Chou, Hsin-Chu (TW);
Chi-Liang Chu, Hsin-Chu (TW);
Wei-Chun Wang, Hsin-Chu (TW)

(73) Assignee: Unimicron Technology Corporation, Taoyuan (TW)

( * ) Notice: Subject to any disclaimer, the term of this patent is extended or adjusted under 35 U.S.C. 154(b) by 220 days.

(21) Appl. No.: 12/136,316

(22) Filed: Jun. 10, 2008

(65) Prior Publication Data

US 2009/0014865 A1 Jan. 15, 2009

(30) Foreign Application Priority Data

Jul. 10, 2007 (TW) ................ 96124995 A

(51) Int. Cl.
*H01L 23/34* (2006.01)
(52) U.S. Cl. .......... 257/720; 257/E23.11; 257/706; 257/707; 257/712; 361/719; 361/780
(58) Field of Classification Search ........... 257/E23.11, 257/E21.512, 706, 707, 712, 713, 720, 739, 257/633, 686; 438/106, 122, 125, 126; 361/719, 361/780, 792, 794, 795; 174/252
See application file for complete search history.

(56) References Cited

U.S. PATENT DOCUMENTS

| | | | | |
|---|---|---|---|---|
| 4,835,598 A | * | 5/1989 | Higuchi et al. ............ | 257/668 |
| 5,285,352 A | * | 2/1994 | Pastore et al. ............ | 361/707 |
| 5,640,048 A | * | 6/1997 | Selna ..................... | 257/738 |
| 6,282,094 B1 | * | 8/2001 | Lo et al. ................. | 361/704 |
| 6,310,391 B1 | * | 10/2001 | Nagasawa et al. ......... | 257/700 |
| 6,528,882 B2 | * | 3/2003 | Ding et al. .............. | 257/738 |
| 6,744,135 B2 | * | 6/2004 | Hasebe et al. ........... | 257/712 |
| 7,050,304 B2 | * | 5/2006 | Hsu et al. ............... | 361/719 |
| 7,071,550 B2 | * | 7/2006 | Sato ..................... | 257/706 |
| 7,242,092 B2 | * | 7/2007 | Hsu ...................... | 257/723 |
| 7,271,479 B2 | * | 9/2007 | Zhao et al. .............. | 257/704 |
| 7,352,063 B2 | * | 4/2008 | Noguchi ................. | 257/707 |
| 7,425,762 B2 | * | 9/2008 | Hasebe et al. ........... | 257/712 |
| 7,521,793 B2 | * | 4/2009 | Alhayek et al. .......... | 257/712 |
| 7,679,176 B2 | * | 3/2010 | Asano et al. ............. | 257/686 |
| 2002/0001937 A1 | * | 1/2002 | Kikuchi et al. ........... | 438/618 |

\* cited by examiner

*Primary Examiner*—Chris Chu
(74) *Attorney, Agent, or Firm*—Schmeiser, Olsen & Watts LLP

(57) ABSTRACT

A heat-conductive package structure includes a carrier board having a first surface and an opposing second surface and formed with a through opening passing the carrier board; a first heat-conductive structure including a heat-conductive hole in the through opening, a first heat-conductive sheet on the carrier board, and a second heat-conductive sheet on the carrier board, wherein the first and second heat-conductive sheets are conductively connected by the heat-conductive hole; a first dielectric layer formed on the first surface of the carrier board and formed with a first opening for exposing the first heat-conductive sheet; a second dielectric layer formed on the second surface of the carrier board and formed with at least a second opening for exposing a portion of the second heat-conductive sheet; and a second heat-conductive structure formed in the second opening and mounted on the second heat-conductive sheet.

20 Claims, 8 Drawing Sheets

HEAT-CONDUCTIVE PACKAGE STRUCTURE

BACKGROUND OF THE INVENTION

1. Field of the Invention

The present invention relates to package structures, and more particularly, to a heat-conductive package structure.

2. Description of Related Art

Owing to advances in semiconductor package technology, there are various packages for semiconductor devices nowadays. Ball Grid Array (BGA) is an advanced semiconductor package technique, characterized by mounting a semiconductor chip on a package substrate, and having a plurality of solder balls arranged in a grid array and formed on the back of the package substrate, thereby increasing the number of I/O connections in unit area. Ball Grid Array not only meets the high integration requirements for a semiconductor chip but also enables the semiconductor chip to be electrically connected to an external device via solder balls.

With the electronic industry booming, electronic products are becoming more multi-function and high-performance. To meet the packaging requirements for high integration and miniaturization of semiconductor packages, semiconductor chips nowadays generate an increasingly great amount of heat during operation. Failure to timely dissipate the heat generated by semiconductor chips can deteriorate the performance of the semiconductor chips and shorten the life of the semiconductor chips.

FIG. 1 is a cross-sectional view showing a semiconductor component mounted on a conventional circuit board. The carrier board 100 has a first surface 100a and a second surface 100b. The carrier board 100 is a circuit board with a circuit. The first surface 100a and the second surface 100b are formed with a first dielectric layer 11a and a second dielectric layer 11b thereon respectively. The first and second dielectric layers 11a, 11b are formed with first and second circuit layers 12a, 12b thereon respectively. The first circuit layer 12a has first electrically connecting pads 121a and second electrically connecting pads 122a thereon. The second circuit layer 12b has third electrically connecting pads 121b thereon. At least a plated through hole (PTH) 13 is formed in the carrier board 100 and the first and second dielectric layers 11a, 11b to electrically connect the first and second circuit layers 12a, 12b. An insulating protective layer 14 is formed on the first and second dielectric layers 11a, 11b and first and second circuit layers 12a, 12b. Insulating protective layer openings 140, 141 are formed in the insulating protective layer 14 to expose the first and second electrically connecting pads 121a, 122a and third electrically connecting pads 121b. A metal protective layer 16 made of nickel/gold (by nickel-plating and then gold-plating) is formed on the surfaces of the first, second and third electrically connecting pads 121a, 122a and 121b. A conductive element 15, such as a solder ball, is formed on the metal protective layer 16 on the first and third electrically connecting pads 121a, 121b for electrical connection with another electronic device. A semiconductor component 17 is mounted on the insulating protective layer 14 on the first surface 100a of the carrier board 100. The semiconductor component 17 has an active surface 17a and an inactive surface 17b opposing to the active surface 17a. A plurality of electrode pads 171 are formed on the active surface 17a of the semiconductor component 17. The semiconductor component 17 is mounted on the first surface 100a of the carrier board 100 via the inactive surface 17b. The second electrically connecting pads 122a covered with the metal protective layer 16 are exposed from the insulating protective layer opening 141 of the insulating protective layer 14. A second conductive element 18, such as a metal wire, is formed on the metal protective layer 16 to electrically connect the electrode pads 171 on the semiconductor component 17 and the second electrically connecting pads 122a. Afterward, an encapsulant 19 encapsulates and thereby protects the wire-bonded second conductive element 18 and semiconductor component 17.

Nevertheless, heat generated by the packaged semiconductor component 17 on the first dielectric layer 11a is unlikely to be dissipated efficiently. Also, the inactive surface 17b of the semiconductor component 17 is in contact with the insulating protective layer 14, but the insulating protective layer 14 is almost incapable of heat dissipation. As a result, the semiconductor component 17 is likely to be overheated and damaged.

FIG. 2A is a cross-sectional view showing a semiconductor component mounted on another conventional circuit board, in which a carrier board 100 (like the one shown in FIG. 1) with a first surface 100a is provided. An opening 110a is formed in a first dielectric layer 11a disposed on the first surface 100a to expose the carrier board 100. An insulating protective layer opening 142 is formed in the insulating protective layer 14 disposed on the first dielectric layer 11a to expose the second electrically connecting pads 122a on the first circuit layer 12a formed on the first dielectric layer 11a and the opening 110a of the first dielectric layer 11a. The metal protective layer 16 is formed on the second electrically connecting pads 122a. The inactive surface 17b of the semiconductor component 17 is in contact with a portion of the carrier board 100 exposed from the opening 110a. The second conductive element 18 electrically connects the electrode pads 171 on the active surface 17a of the semiconductor component 17 and the metal protective layer 16 on the second electrically connecting pads 122a. The encapsulant 19 encapsulates and thereby protects the wire-bonded second conductive element 18 and semiconductor component 17. The semiconductor component 17 is received in the opening 110a, so as to reduce the total thickness of the semiconductor package.

The semiconductor component 17 is embedded in the opening 110a of the first dielectric layer 11a to shorten an electrical conduction path, lessen signal loss and distortion, enhance high-speed performance, and downsize a wire-bonded and encapsulated semiconductor package. But little heat conduction or heat dissipation takes place through the contact between the carrier board 100 and the inactive surface 17b of the semiconductor component 17. As a result, heat generated by the semiconductor component 17 in operation cannot be efficiently dissipated.

FIG. 2B is a cross-sectional view showing semiconductor components stacked up and mounted on another conventional circuit board. The semiconductor component 17 includes a first semiconductor chip 17' and a second semiconductor chip 17" stacked on the first semiconductor chip 17'. The first semiconductor chip 17' is mounted on a portion of the carrier board 100 exposed from the opening 110a, via the inactive surface 17b of the first semiconductor chip 17'. The electrode pads 171', 171" on the first semiconductor chip 17' and the second semiconductor chip 17" are electrically connected to the metal protective layer 16 on the second electrically connecting pads 122a, via the second conductive element 18.

The second semiconductor chip 17" is stacked on the first semiconductor chip 17', wherein the inactive surface 17b" of the second semiconductor chip 17" in connected to the active surface 17a' of the first semiconductor chip 17'. The first semiconductor chip 17' is mounted on the carrier board 100 via the inactive surface 17b', but the carrier board 100 is unfit for heat conductive and heat dissipation. Hence, heat generated by the semiconductor component in operation cannot be efficiently dissipated.

It is an urgent issue to develop a heat-conductive package structure in order to enhance heat dissipation of a semiconductor component in operation, downsize a semiconductor package, and overcome the drawbacks of the prior art.

SUMMARY OF THE INVENTION

In the light of foregoing drawbacks of the prior art, a primary objective of the present invention is to provide a heat-conductive package structure, to enable a semiconductor component to dissipate heat via a heat-conductive structure.

Another objective of the present invention is to provide a heat-conductive package structure, to downsize a semiconductor package and thereby achieve miniaturization of the semiconductor package.

A further objective of the present invention is to provide a heat-conductive package structure, to enhance heat dissipation of the semiconductor component, prevent the semiconductor component and the circuit board from damage, enhance electrical performance of the semiconductor component and the circuit board, and prolong the life of the semiconductor component.

To attain the above and other objectives, the present invention provides a heat-conductive package structure, including: a carrier board with a first surface, a second surface opposing to the first surface, and at least a through opening passing the first and second surfaces; a first heat-conductive structure having a heat-conductive hole in the through opening, a first heat-conductive sheet on the first surface of the carrier board, and a second heat-conductive sheet on the second surface of the carrier board, wherein the first and second heat-conductive sheets are conductively connected by the heat-conductive hole; a first dielectric layer disposed on the first surface of the carrier board and formed with a first opening for exposing the first heat-conductive sheet; a semiconductor component having an active surface and an inactive surface opposing to the active surface, wherein the semiconductor component is mounted on the first heat-conductive sheet via the inactive surface; a second dielectric layer disposed on the second surface of the carrier board and formed with at least a second opening for exposing a portion of the second heat-conductive sheet; and a second heat-conductive structure disposed in the second opening and mounted on the second heat-conductive sheet.

The carrier board is a circuit board with a circuit or an insulated board. The first and second heat-conductive sheets respectively have a metal layer thereon. The heat-conductive hole is one selected from the group consisting of a non-fully plated metal through hole, fully plated metal through hole, solid metal heat-conductive via, and hollow heat-conductive via. The second heat-conductive structure is a hollow heat-conductive via or a solid heat-conductive via.

First and second circuit layers are disposed on the first and second dielectric layers respectively. The first circuit layer has a plurality of first and second electrically connecting pads thereon. The second circuit layer has a plurality of first electrically connecting pads thereon.

An insulating protective layer is disposed on the first and second dielectric layers. An insulating protective layer opening is disposed in the insulating protective layer to expose the first heat-conductive structure in the first opening of the first dielectric layer and expose the first and second electrically connecting pads. A first conductive element, such as a solder ball or a metal pin, is disposed on the first electrically connecting pads in the insulating protective layer opening.

A heat-dissipating element, such as a solder ball or a metal pin, is disposed on the exposed surface of the second heat-conductive structure. The heat-conductive package structure of the present invention further includes a second conductive element for electrically connecting the electrode pads on the semiconductor component and the second electrically connecting pads on the first circuit layer.

The semiconductor component is a chipset having a first semiconductor chip and a second semiconductor chip. The first and second semiconductor chips are active chips or passive chips. A plurality of electrode pads are disposed on the active surfaces of the first and second semiconductor chips. The second conductive element electrically connects the electrode pads on the first and second semiconductor chips and the second electrically connecting pads on the first circuit layer. The second conductive element is a metal wire.

First and second heat-conductive structures are provided for the carrier board and the second dielectric layer. A heat-dissipating element, such as a solder ball or a metal pin, is disposed on the exposed surface of the second heat-conductive structure. A first opening is formed in the carrier board to receive the semiconductor component and enable the semiconductor component to be mounted on the heat-conductive structure. Hence, heat generated by the semiconductor component in operation is transferred to a heat-dissipating element outside the carrier board, via the heat-conductive structure, for heat dissipation. Accordingly, the heat-conductive package structure of the present invention prevents a semiconductor component and a circuit board from being overheated and damaged, and prolongs the life of the semiconductor component and the circuit board.

BRIEF DESCRIPTION OF THE DRAWINGS

FIG. 3A' is a cross-sectional view of another embodiment shown in FIG. 3A;

FIG. 3F' is a cross-sectional view showing semiconductor chips stacked up and mounted on a heat-conductive package structure according to the present invention;

DETAILED DESCRIPTION OF THE PREFERRED EMBODIMENTS

The following illustrative embodiments are provided to illustrate the disclosure of the present invention, these and other advantages and effects can be apparent to those skilled in the art after reading the disclosure of this specification.

FIGS. 3A to 3F are cross-sectional views showing a method for fabricating a heat-conductive package structure according to the first embodiment of the present invention.

Figure 1:
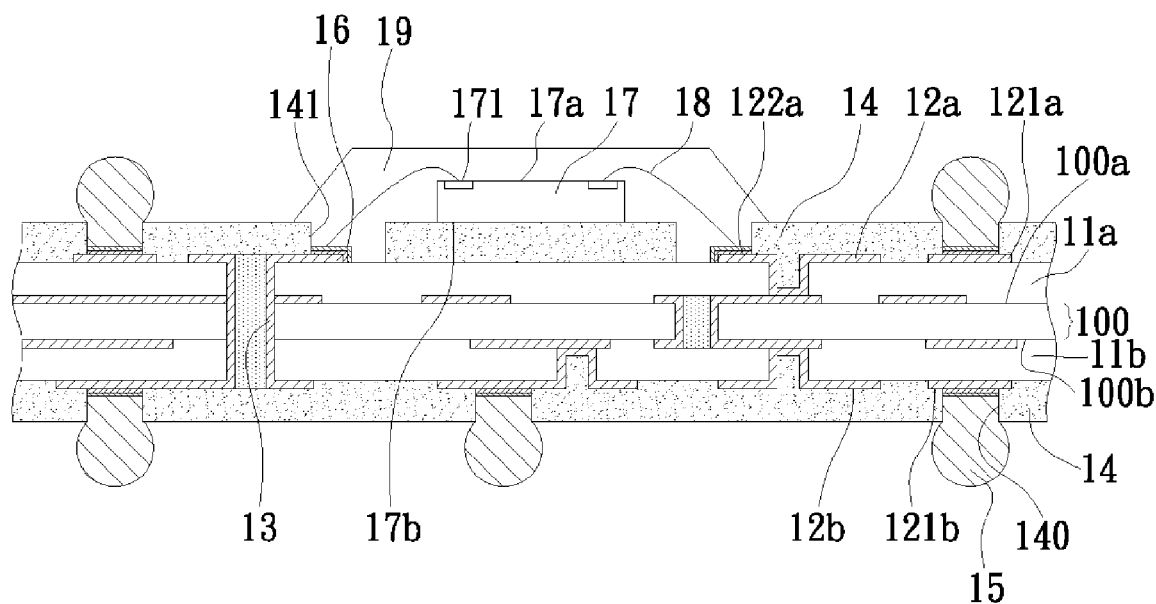
FIG. 1 is a cross-sectional view showing a semiconductor component mounted on a conventional circuit board in the prior art.
Figure 2A:
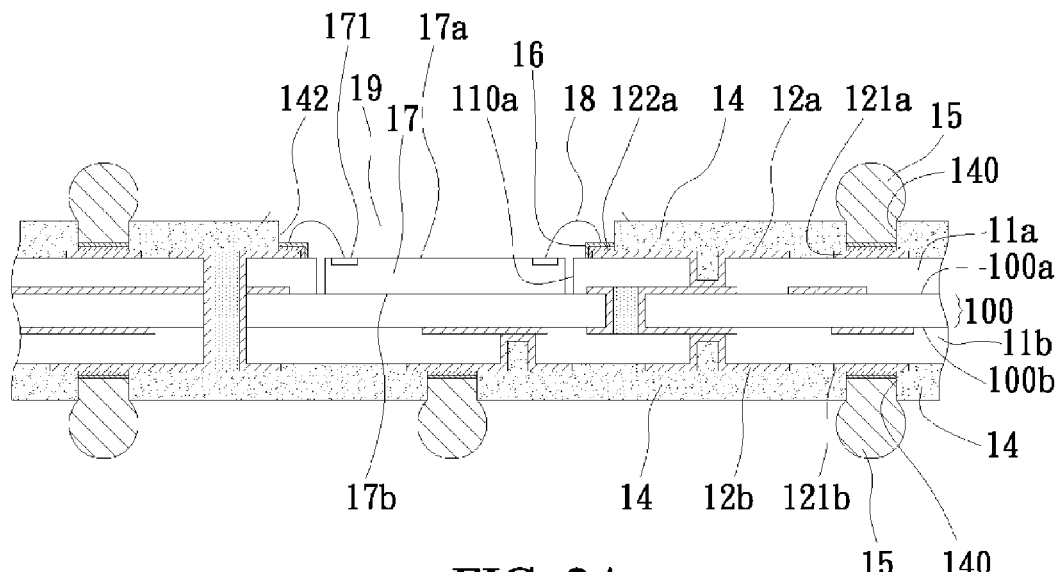
FIG. 2A is a cross-sectional view showing a semiconductor component mounted on another conventional circuit board in the prior art.
Figure 2B:
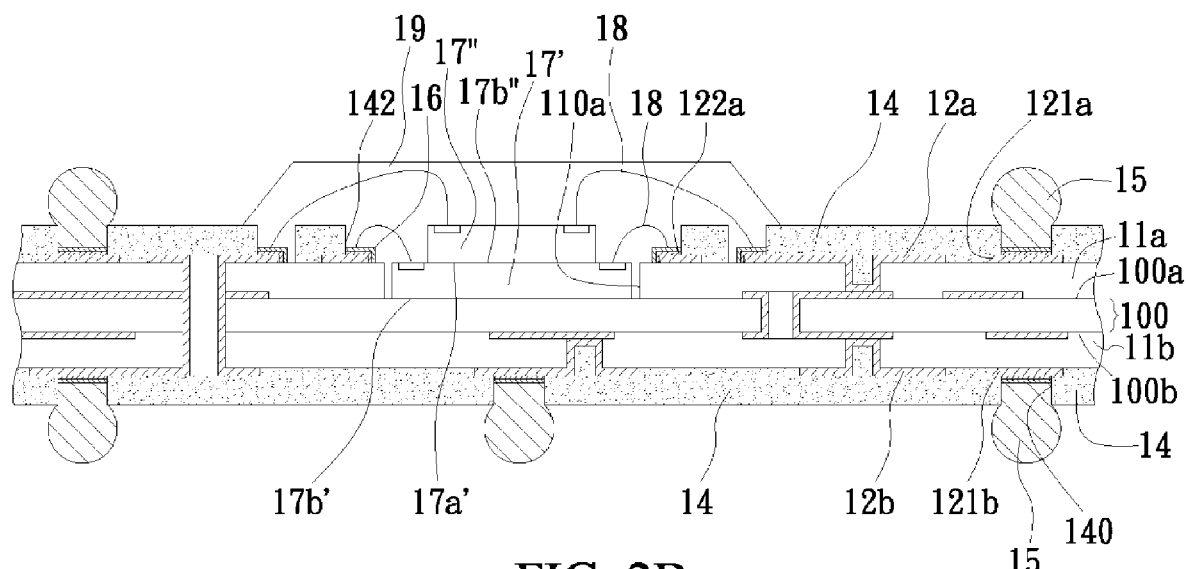
FIG. 2B is a cross-sectional view showing semiconductor components stacked up and mounted on a conventional circuit board in the prior art.
Figure 3A:
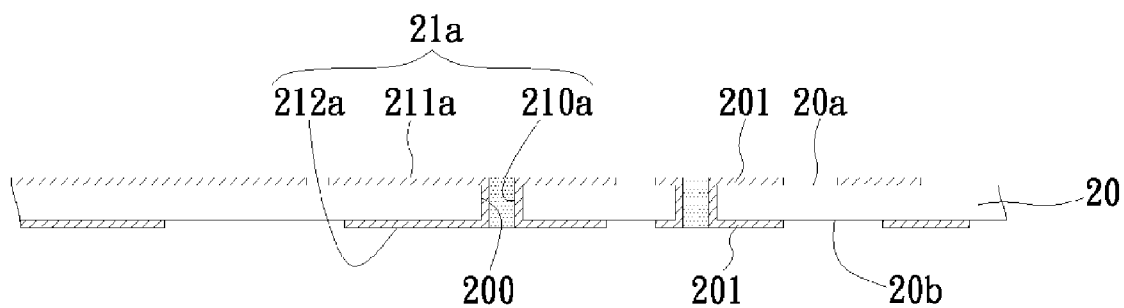
FIGS. 3A to 3F are cross-sectional views showing a method for fabricating a heat-conductive package structure according to the first embodiment of the present invention.
Figure 3A:
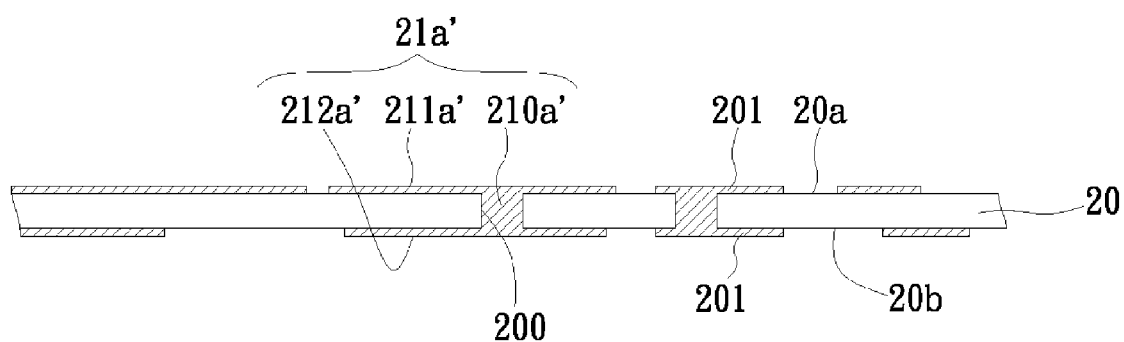

Referring to FIGS. 3A and 3A', a carrier board is provided. The carrier board is a circuit board 20 with a circuit 201 or an insulated board. The first embodiment is exemplified by a circuit board 20 with a circuit 201. The circuit board 20 includes a first surface 20a, a second surface 20b opposing to the first surface 20a, and at least a through opening 200 passing the first surface 20a and the second surface 20b. In the through opening 200, a first heat-conductive structure 21a is formed. The first heat-conductive structure 21a is not electrically connected to the circuit 201 and can be a non-fully plated metal through hole, as shown in FIG. 3A. Alternatively, a first heat-conductive structure 21a' is formed in the through opening 200, and the heat-conductive structure 21a' can be a fully plated metal through hole, as shown in 3A'. The first heat-conductive structure 21a, 21a' includes a heat-conductive hole 210a, 210a' in the through opening 200, a first heat-conductive sheet 211a, 211a' on the first surface 20a of the carrier board, and a second heat-conductive sheet 212a, 212a' on the second surface 20b of the carrier board. The first heat-conductive sheet 211a, 211a' and the second heat-conductive sheet 212a, 212a' are conductively connected by the heat-conductive hole 210a, 210a'. Hereinafter the first embodiment is exemplified by the first heat-conductive structure 21a which is a plated through hole.

Figure 3B:
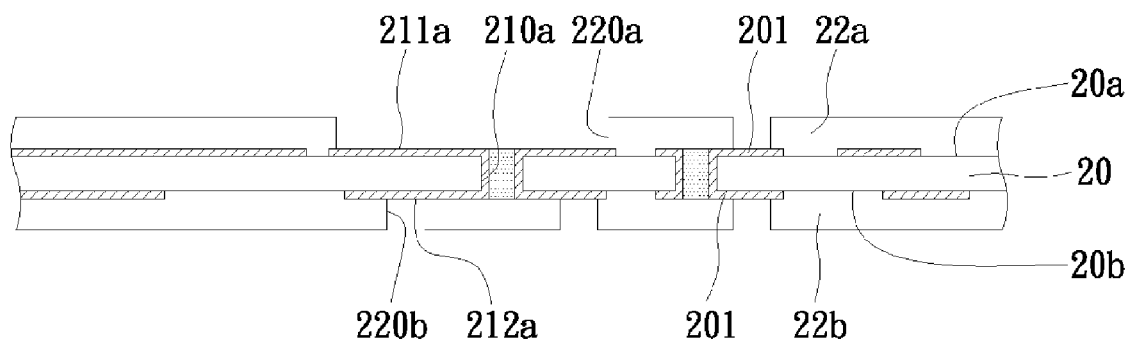

Referring to FIG. 3B, the first surface 20a and the second surface 20b of the circuit board 20 are formed with a first dielectric layer 22a and a second dielectric layer 22b respectively. In the first dielectric layer 22a, at least a first opening 220a is formed to expose the first heat-conductive sheet 211a of the first heat-conductive structure 21a. In the second dielectric layer 22b, at least a second opening 220b is formed to expose a portion of the second heat-conductive sheet 212a of the first heat-conductive structure 21a.

Figure 3C:
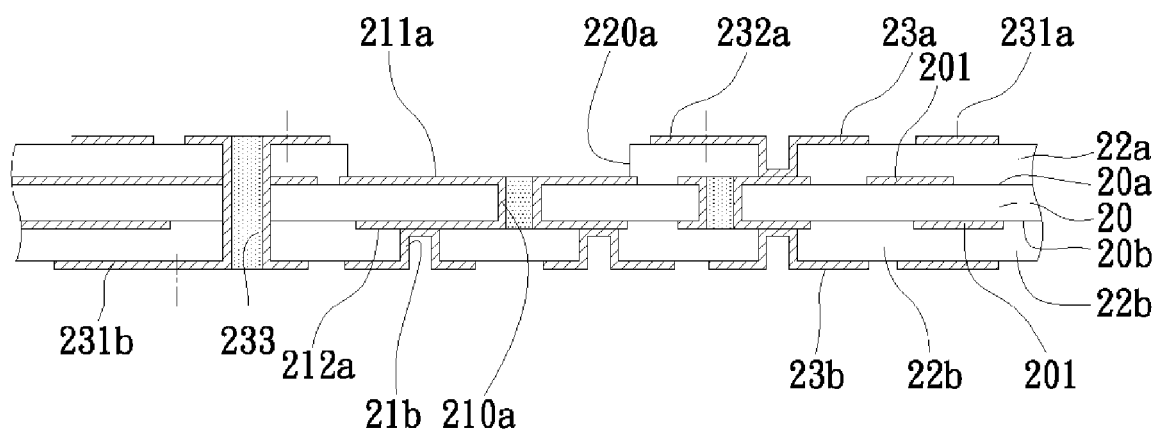

Referring to FIG. 3C, first and second circuit layers 23a, 23b are formed on the first and second dielectric layers 22a, 22b respectively. The first circuit layer 23a is formed with a plurality of first electrically connecting pads 231a and second electrically connecting pads 232a. The second circuit layer 23b is formed with a plurality of third electrically connecting pads 231b. A second heat-conductive structure 21b, such as a heat-conductive via, is formed in the second opening 220b of the second dielectric layer 22b. The second heat-conductive structure 21b is not electrically connected to the second circuit layer 23b, but is in contact with the second heat-conductive sheet 212a of the first heat-conductive structure 21a. A plated through hole 233 is formed in the circuit board 20, first dielectric layer 22a, second dielectric layer 22b, and first and second circuit layers 23a, 23b so as to electrically connect the circuit 201 of the circuit board 20 and the first or second circuit layer 23a, 23b.

Figure 3D:
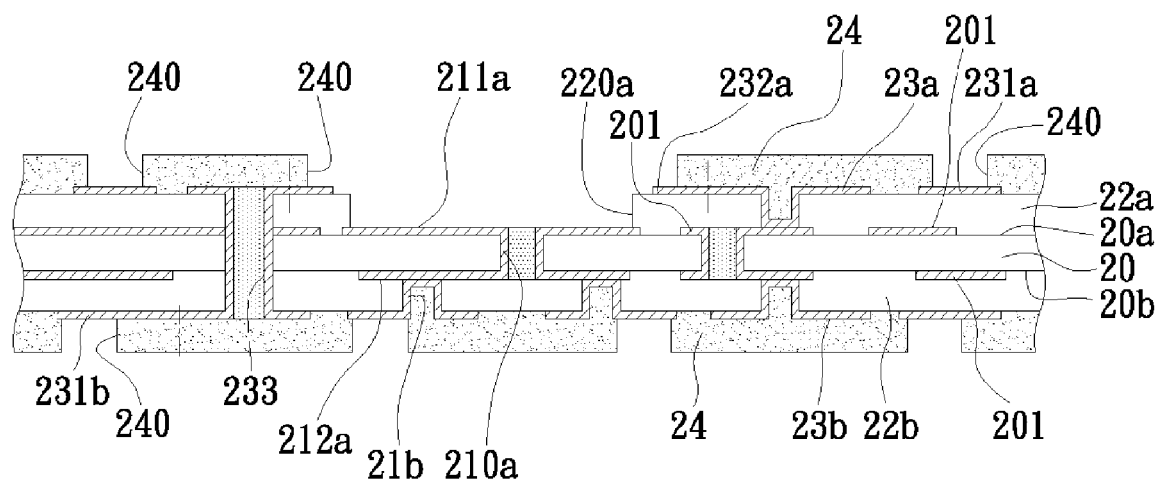

Referring to FIG. 3D, an insulating protective layer 24 is formed on the first dielectric layer 22a and first circuit layer 23a, as well as on the second dielectric layer 22b and second circuit layer 23b, respectively. An insulating protective layer opening 240 is formed in the insulating protective layer 24 to expose the first heat-conductive sheet 211a of the first heat-conductive structure 21a in the first opening 220a of the first dielectric layer 22a, the surface of second heat-conductive structure 21b in the second opening 220b of the second dielectric layer 22b, and surfaces of the first, second and third electrically connecting pads 231a, 232a, 231b.

Figure 3E:
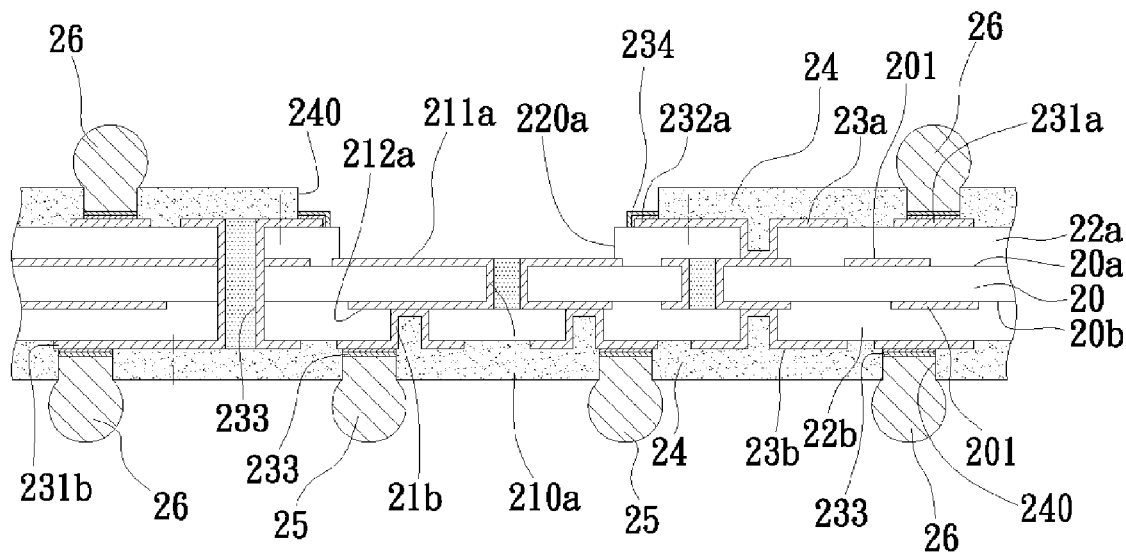

Referring to FIG. 3E, a metal protective layer 234 made of nickel/gold (by nickel-plating and then gold-plating) is formed on the surface of the second heat-conductive structure 21b and the surfaces of the first, second and third electrically connecting pads 231a, 232a, 231b, and then a heat-dissipating element 25, such as a solder ball, is formed on the metal protective layer 234 on the surface the second heat-conductive structure 21b, thereby allowing the heat-dissipating element 25 to be connected to the second heat-conductive structure 21b and the first heat-conductive structure 21a. A first conductive element 26, such as a solder ball, may be formed on the metal protective layer 234 on the surfaces of the first and third electrically connecting pads 231a, 231b, wherein the first conductive elements 26 on the first electrically connecting pads 231a can be mounted with one passive component or other package structure (FIG. not shown).

Figure 3F:
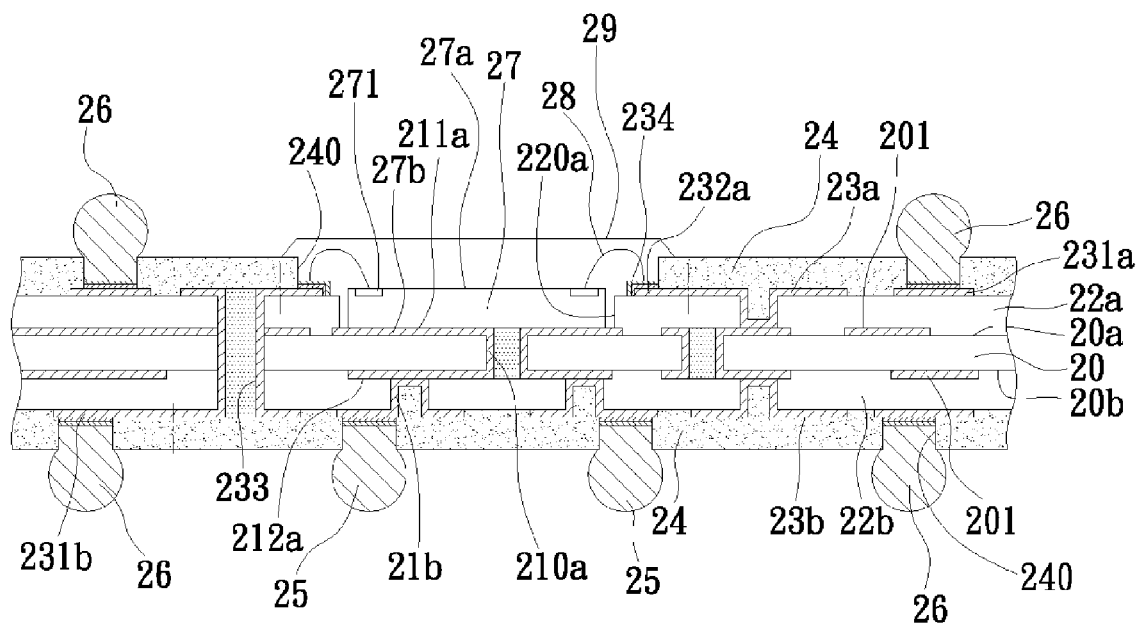
Figure 3F:
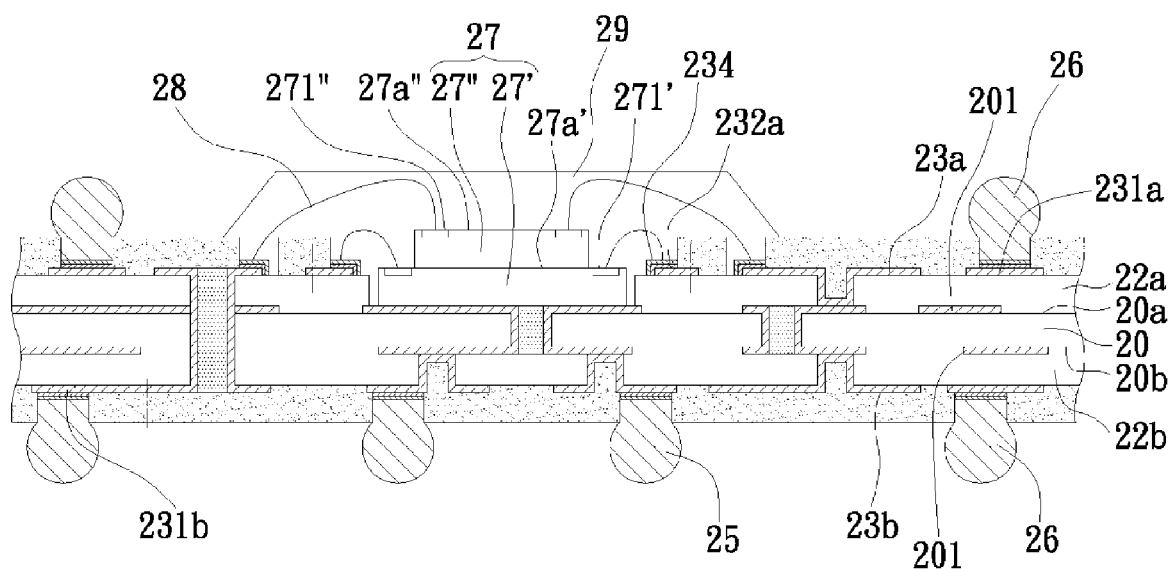

Referring to FIG. 3F, a semiconductor component 27 is received in the first opening 220a of the first dielectric layer 22a in which the semiconductor component 27 is an active chip or a passive chip and includes an active surface 27a and an inactive surface 27b. The semiconductor component 27 is mounted on the first heat-conductive sheet 211a exposed from the first opening 220a of the first dielectric layer 22a, via the inactive surface 27b. Heat generated by the semiconductor component 27 in operation is dissipated by the first heat-conductive sheet 211a, the heat-conductive hole 210a, the second heat-conductive sheet 212a, the second heat-conductive structure 21b, and the heat-dissipating element 25.

The semiconductor component 27 has a plurality of electrode pads 271 on the active surface 27a. A plurality of second conductive elements 28 are electrically connected to the metal protective layer 234 on the second electrically connecting pads 232a of the first circuit layer 23a. As a result, the semiconductor component 27 is electrically connected to the first circuit layer 23a. An encapsulant 29 encapsulates and thereby protects the wire-bonded second conductive element 28 and semiconductor component 27.

Referring to FIG. 3F', the semiconductor component 27 is a chipset having a first semiconductor chip 27' and a second semiconductor chip 27''. The first semiconductor chip 27' and the second semiconductor chip 27'' are active chips or passive chips. The first semiconductor chip 27' and the second semiconductor chip 27'' have a plurality of electrode pads 271', 271'' on the active surfaces 27a', 27a'' respectively. The electrode pads 271', 271'' of the first and second semiconductor chips 27', 27'' are electrically connected to the second electrically connecting pads 232a on the first circuit layer 23a via the second conductive element 28.

Figure 4A:
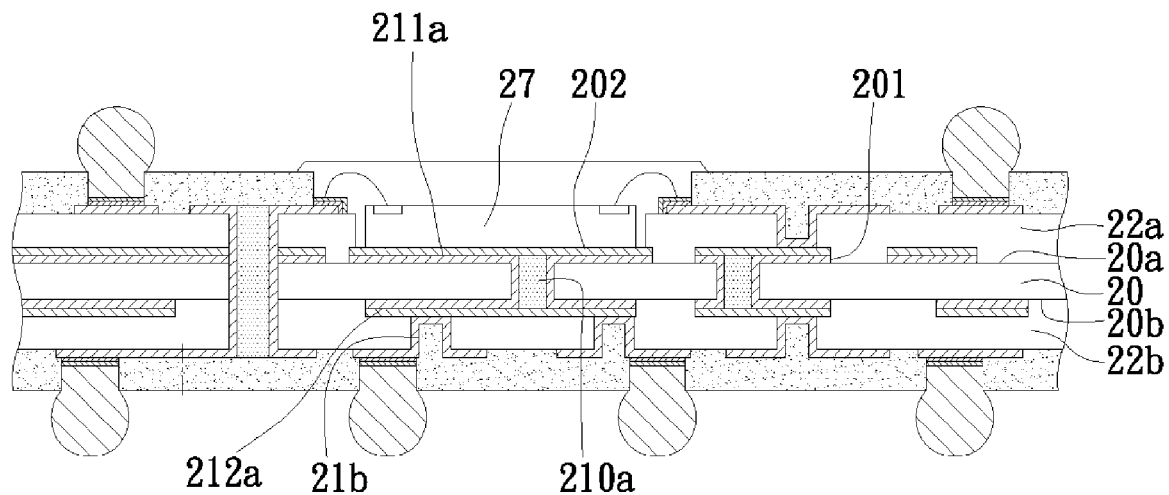
FIGS. 4A and 4B are cross-sectional views showing a method for fabricating a heat-conductive package structure according to the second embodiment of the present invention.
Figure 4B:
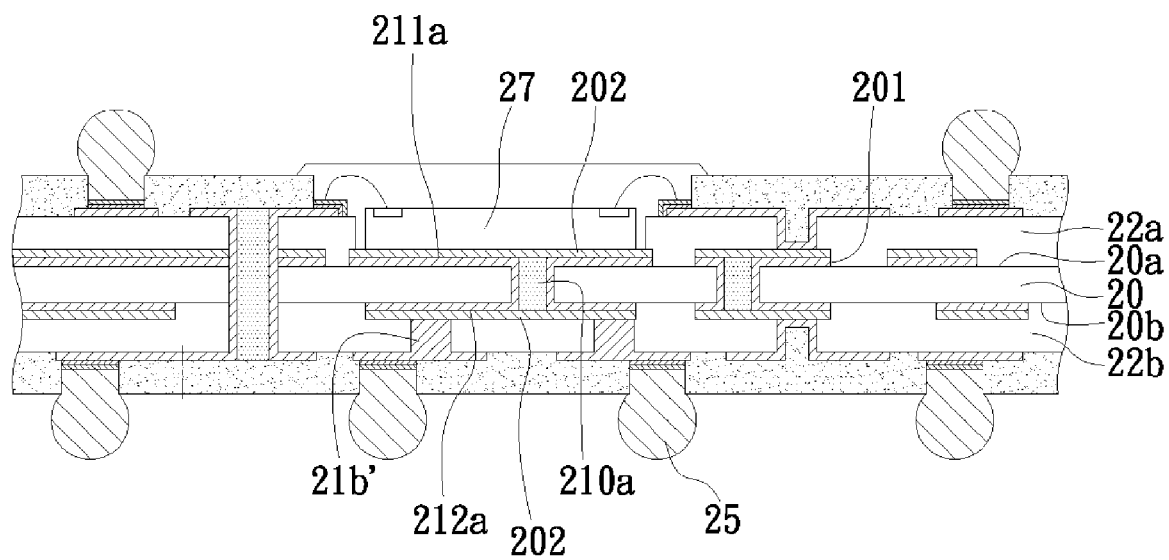

FIGS. 4A and 4B are cross-sectional views showing another embodiment of the present invention. Referring to FIG. 4A, the first and second heat-conductive sheets are further formed with a metal layer thereon. Referring to FIG. 4A, the second heat-conductive structure 21b is a hollow heat-conductive via. Referring to FIG. 4B, the second heat-conductive structure 21b' is a solid heat-conductive via.

As shown in FIG. 4A, a metal layer 202 is formed on the circuit 201 on the first surface 20a and the second surface 20b of the circuit board 20, and the metal layer 202 covers the first and second heat-conductive sheets 211a, 212a of the first heat-conductive structure 21a. As a result, the metal layer 202 covers the first and second heat-conductive sheets 211a, 212a at both ends of the heat-conductive hole 210a (the heat-conductive hole 210a is, for example, an non-fully plated metal through hole) so as to increase the area of contact between the first heat-conductive structure 21a and the semiconductor component 27, so as to enhance the efficiency of heat transfer.

Referring to FIG. 4B, the second heat-conductive structure 21b' in the second dielectric layer 22b is a solid heat-conductive via, and the first and second heat-conductive sheets 211a, 212a of the first heat-conductive structure 21a are covered with the metal layer 202. Thus, the second heat-conductive structure 21b' is mounted on a central portion of the first heat-conductive structure 21a so as to increase layout density.

Figure 5A:
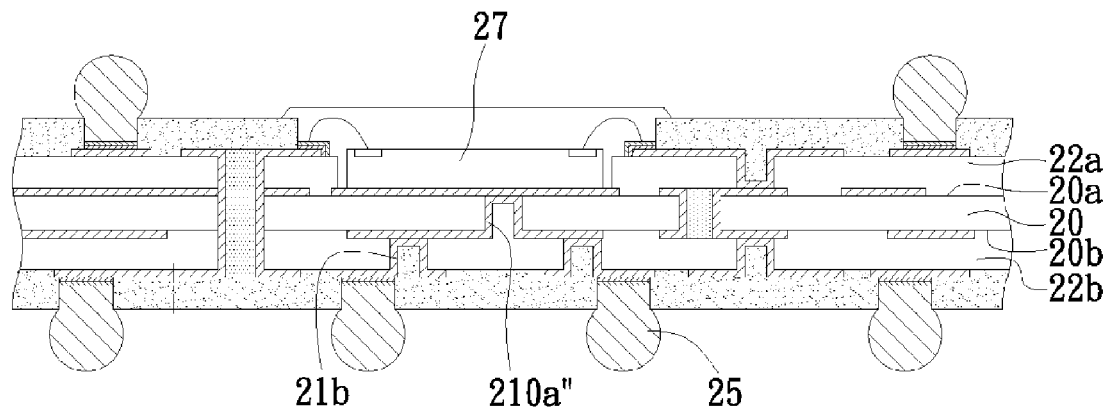
FIGS. 5A to 5C are cross-sectional views showing a method for fabricating a heat-conductive package structure according to the third embodiment of the present invention.
Figure 5B:
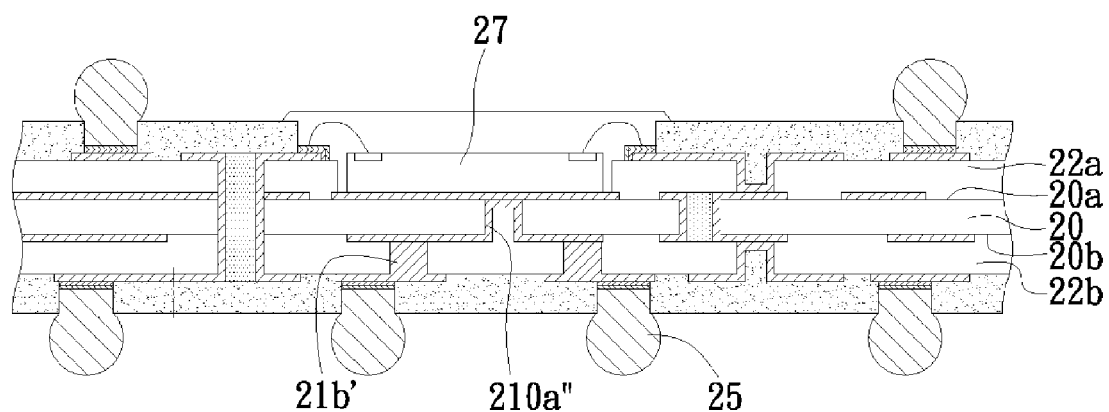
Figure 5C:
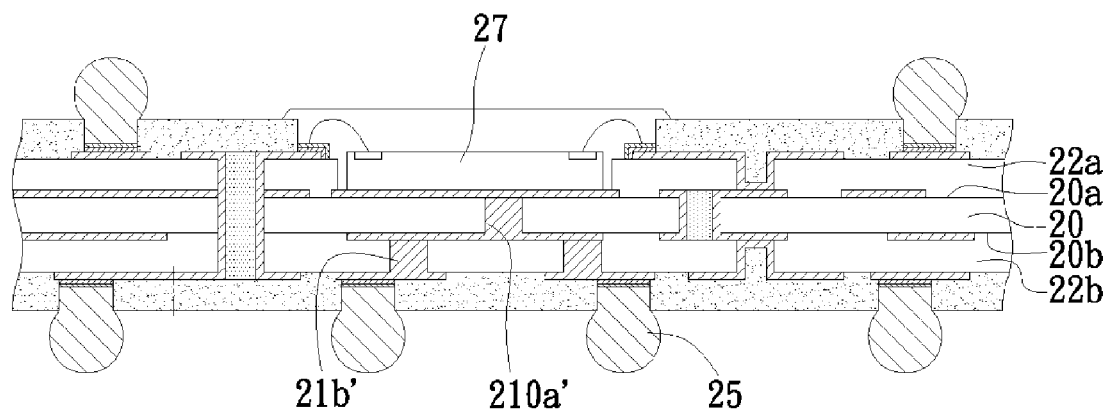

Referring to FIGS. 5A to 5C, which are cross-sectional views of yet another embodiment of the present invention, the first heat-conductive structure is a solid heat-conductive via or a hollow heat-conductive via, and the second heat-conductive structure is a solid heat-conductive via or a hollow heat-conductive via.

Referring to FIG. 5A, a heat-conductive hole 210a" in the circuit board 20 is a hollow heat-conductive via, and the second heat-conductive structure 21b is a hollow heat-conductive via as well. The structural similarity between the heat-conductive hole 210a" and the second heat-conductive structure 21b makes the fabrication process simpler.

Referring to FIG. 5B, the heat-conductive hole 210a" in the circuit board 20 is a hollow heat-conductive via, and the second heat-conductive structure 21b' is a solid heat-conductive via. Hence, the second heat-conductive structure 21b' enhances the efficiency of heat transfer.

Referring to FIG. 5C, a heat-conductive hole 210a' in the circuit board 20 is a solid heat-conductive via, and the second heat-conductive structure 21b' is a solid heat-conductive via as well. Thus, the heat-conductive hole 210a' and the second heat-conductive structure 21b' enhance the efficiency of heat transfer.

According to the present invention, a heat-conductive package structure includes a carrier board, a first heat-conductive structure 21a, a first dielectric layer 22a, a second dielectric layer 22b, a first dielectric layer 22a, a second dielectric layer 22b, a first circuit layer 23a, a second circuit layer 23b, a semiconductor component 27, an insulating protective layer 24 and a heat-dissipating element 25. The carrier board is formed with a circuit 201 or an insulated board, and has a first surface 20a, a second surface 20b opposing to the first surface 20a, and at least a through opening 200 passing the first surface 20a and the second surface 20b. The first heat-conductive structure 21a has a heat-conductive hole 210a in the through opening 200, a first heat-conductive sheet 211a on the first surface 20a of the carrier board, and a second heat-conductive sheet 212a on the second surface 20b of the carrier board, wherein the first and second heat-conductive sheets 211a, 212a are conductively connected by the heat-conductive hole 210a. The first dielectric layer 22a and a second dielectric layer 22b are disposed on the first surface 20a and the second surface 20b of the circuit board 20 respectively, wherein a first opening 220a is formed in the first dielectric layer 22a to expose the first heat-conductive sheet 211a, and at least a second opening 220b is formed in the second dielectric layer 22b to expose a portion of the second heat-conductive sheet 212a. The second heat-conductive structure 21b is formed in the second opening 220b. The first circuit layer 23a and a second circuit layer 23b are formed on the first and second dielectric layers 22a, 22b respectively, wherein the first circuit layer 23a is formed with a plurality of first electrically connecting pads 231a and second electrically connecting pads 232a, and the second circuit layer 23b is formed with a plurality of third electrically connecting pads 231b. The semiconductor component 27 is received in the first opening 220a of the first dielectric layer 22a. The semiconductor component 27 is an active chip or a passive chip, has an active surface 27a and an inactive surface 27b, and is mounted on the first heat-conductive structure 21a exposed from the first opening 220a of the first dielectric layer 22a via the inactive surface 27b. The insulating protective layer 24 is formed on the first and second dielectric layers 22a, 22b and the first and second circuit layers 23a, 23b, and is formed with an insulating protective layer opening 240 for exposing the first heat-conductive structure 21a in the first opening 220a of the first dielectric layer 22a, the second heat-conductive structure 21b in the second dielectric layer 22b, and the first, second and third electrically connecting pads 231a, 232a, 231b. The heat-dissipating element 25 is formed on the second heat-conductive structure 21b in the insulating protective layer opening 240.

A metal protective layer 234 made of nickel/gold (by nickel-plating and then gold-plating) is formed on the surface of the second heat-conductive structure 21b exposed from the insulating protective layer opening 240 and the surfaces of the first, second and third electrically connecting pads 231a, 232a, 231b. A first conductive element 26, such as a solder ball, is formed on the metal protective layer 234 on the first and third electrically connecting pads 231a, 231b. An encapsulant 29 encapsulates and thereby protects the wire-bonded second conductive element 28 and semiconductor component 27.

The heat-conductive hole 210a of the first heat-conductive structure 21a is an non-fully plated metal through hole, a fully plated metal through hole, a solid metal heat-conductive via, or a hollow heat-conductive via. The second heat-conductive structure 21b is a hollow heat-conductive via or a solid heat-conductive via. The heat-dissipating element 25 and the first conductive element 26 are solder balls or metal pins.

According to the present invention, a heat-conductive package structure further includes a metal layer 202 formed on the circuit 201 on the first surface 20a and the second surface 20b of the circuit board 20 and covering the first heat-conductive structure 21a.

According to the present invention, a heat-conductive package structure includes a carrier board formed with first and second heat-conductive structures therein, wherein a semiconductor component is mounted on the first heat-conductive structure. Thus, the heat generated by the semiconductor component in operation is transferred to an external heat-dissipating element by means of the first and second heat-conductive structures. Hence, the present invention provides a heat transfer path for a semiconductor component to enhance heat dissipation of the semiconductor component, prevents the semiconductor component and the circuit board from damage, and enhances electrical performance of the circuit board.

The above embodiments only illustrate the principles of the present invention, and they should not be construed as to limit the present invention in any way. The above embodiments can be modified or altered by those with ordinary skills in the art without departing from the spirit and scope of the present invention as defined in the following appended claims.

What is claimed is:

1. A heat-conductive package structure, comprising:
a carrier board with a first surface, a second surface opposing the first surface, and at least a through opening passing the first and second surfaces;
a first heat-conductive structure comprising a heat-conductive hole in the through opening, a first heat-conductive sheet on the first surface of the carrier board, and a second heat-conductive sheet on the second surface of the carrier board, wherein the first and second heat-conductive sheets are conductively connected by the heat-conductive hole;
a first dielectric layer disposed on the first surface of the carrier board and formed with a first opening for exposing the first heat-conductive sheet;
a semiconductor component having an active surface and an inactive surface opposing to the active surface, wherein the semiconductor component is mounted on the first heat-conductive sheet via the inactive surface;

a second dielectric layer disposed on the second surface of the carrier board and formed with at least a second opening for exposing a portion of the second heat-conductive sheet; and a second heat-conductive structure disposed in the second opening and mounted on the second heat-conductive sheet.

2. The heat-conductive package structure of claim 1, wherein the carrier board is one of an insulated board and a circuit board with a circuit.

3. The heat-conductive package structure of claim 1, wherein the first and second heat-conductive sheets further comprise a metal layer.

4. The heat-conductive package structure of claim 1, wherein the heat-conductive hole is one selected from the group consisting of non-fully plated metal through hole, fully plated metal through hole, solid metal heat-conductive via, and hollow heat-conductive via.

5. The heat-conductive package structure of claim 1, wherein the second heat-conductive structure is one of hollow heat-conductive via and solid heat-conductive via.

6. The heat-conductive package structure of claim 1, further comprising first and second circuit layers disposed on the first and second dielectric layers respectively, wherein the first circuit layer is formed with a plurality of first and second electrically connecting pads, and the second circuit layer is formed with a plurality of third electrically connecting pads.

7. The heat-conductive package structure of claim 6, further comprising an insulating protective layer disposed on the first and second dielectric layers, wherein an insulating protective layer opening is formed in the insulating protective layer to expose the first heat-conductive structure in the first opening of the first dielectric layer and expose the first, second and third electrically connecting pads.

8. The heat-conductive package structure of claim 7, wherein a first conductive element is disposed on the first and third electrically connecting pads in the insulating protective layer opening.

9. The heat-conductive package structure of claim 8, wherein the first conductive element is one of a solder ball and a metal pin.

10. The heat-conductive package structure of claim 7, further comprising a heat-dissipating element formed on an exposed surface of the second heat-conductive structure.

11. The heat-conductive package structure of claim 10, wherein the heat-dissipating element is one of a solder ball and a metal pin.

12. The heat-conductive package structure of claim 1, wherein the semiconductor component is one of an active chip and a passive chip.

13. The heat-conductive package structure of claim 12, wherein a plurality of electrode pads are formed on the active surface of the semiconductor component.

14. The heat-conductive package structure of claim 13, further comprising a second conductive element for electrically connecting the electrode pads on the semiconductor component and the second electrically connecting pads on the first circuit layer.

15. The heat-conductive package structure of claim 14, wherein the second conductive element is a metal wire.

16. The heat-conductive package structure of claim 1, wherein the semiconductor component is a chipset comprising a first semiconductor chip and a second semiconductor chip.

17. The heat-conductive package structure of claim 16, wherein the first semiconductor chip and the second semiconductor chip are one of active chips and passive chips.

18. The heat-conductive package structure of claim 17, wherein a plurality of electrode pads are formed on the active surfaces of the first semiconductor chip and the second semiconductor chip.

19. The heat-conductive package structure of claim 18, further comprising a second conductive element for electrically connecting the electrode pads on the first and second semiconductor chips and the second electrically connecting pads on the first circuit layer.

20. The heat-conductive package structure of claim 19, wherein the second conductive element is a metal wire.

* * * * *